US008445768B1

(12) United States Patent
Classen et al.

(10) Patent No.: US 8,445,768 B1
(45) Date of Patent: May 21, 2013

(54) METHOD AND APPARATUS FOR AUDIO MIXING

(75) Inventors: Holger Classen, Hamburg (DE); Sven Duwenhorst, Hamburg (DE)

(73) Assignee: Adobe Systems Incorporated, San Jose, CA (US)

( * ) Notice: Subject to any disclaimer, the term of this patent is extended or adjusted under 35 U.S.C. 154(b) by 61 days.

(21) Appl. No.: 12/882,265

(22) Filed: Sep. 15, 2010

Related U.S. Application Data

(63) Continuation of application No. 11/840,402, filed on Aug. 17, 2007, now Pat. No. 7,825,322.

(51) Int. Cl.
*G10H 1/46* (2006.01)
*H03G 3/00* (2006.01)

(52) U.S. Cl.
USPC .................. 84/633; 84/609; 84/615; 84/618; 84/649; 84/653; 84/656; 84/665

(58) Field of Classification Search
None
See application file for complete search history.

(56) References Cited

U.S. PATENT DOCUMENTS

| | | | | |
|---|---|---|---|---|
| 6,281,420 | B1 * | 8/2001 | Suzuki et al. | 84/477 R |
| 6,546,188 | B1 | 4/2003 | Ishii et al. | |
| 7,194,686 | B1 * | 3/2007 | Suzuki et al. | 715/716 |
| 7,230,177 | B2 * | 6/2007 | Kawashima | 84/610 |
| 7,302,644 | B2 | 11/2007 | Holtz et al. | |
| 7,512,886 | B1 | 3/2009 | Herberger et al. | |
| 7,728,212 | B2 * | 6/2010 | Fujishima et al. | 84/600 |
| 7,825,322 | B1 * | 11/2010 | Classen et al. | 84/622 |
| 7,884,275 | B2 * | 2/2011 | Tedman et al. | 84/612 |
| 2002/0109710 | A1 | 8/2002 | Holtz et al. | |
| 2002/0175931 | A1 | 11/2002 | Holtz et al. | |
| 2002/0186233 | A1 | 12/2002 | Holtz et al. | |
| 2007/0292106 | A1 | 12/2007 | Finkelstein et al. | |
| 2008/0044155 | A1 | 2/2008 | Kuspa | |
| 2009/0235809 | A1 * | 9/2009 | Stanley et al. | 84/611 |

* cited by examiner

*Primary Examiner* — Marlo Fletcher
(74) *Attorney, Agent, or Firm* — Kilpatrick Townsend & Stockton LLP

(57) ABSTRACT

A method, apparatus and computer program product for mixing audio is presented. A plurality of tracks is displayed in a user interface, each track of the plurality of tracks including at least one audio clip. Each audio clip is designated as either a foreground clip or a background clip. The foreground clips are analyzed and loudness corrected. The background clips are analyzed and a distance value between the loudness corrected foreground clips and the background clips is defined. Keyframes are added to some of the audio clips, the keyframes providing a fade between levels of the background clips to take into account the loudness corrected foreground clips and a sequenced audio file is produced from the corrected foreground clips, the background clips and the keyframes.

21 Claims, 6 Drawing Sheets

100

METHOD AND APPARATUS FOR AUDIO MIXING

CROSS REFERENCE TO RELATED APPLICATIONS

This application is a continuation of U.S. Ser. No. 11/840,402 filed on Aug. 17, 2007, now allowed, the contents of which are incorporated herein by reference.

The present application is related to patent application titled "Method and Apparatus for Performing Audio Ducking", Ser. No. 11/840,416, filed on even date herewith, and which is incorporated herein by reference in its entirety.

BACKGROUND

Audio mixing is used for sound recording, audio editing, and sound systems to balance the relative volume, frequency, and dynamical content of a number of sound sources. Typically, these sound sources are the different musical instruments in a band or vocalists, the sections of an orchestra, announcers and journalists, crowd noises, and so on.

Sometimes audio mixing is done live by a sound engineer or recording engineer, for example at rock concerts and other musical performances where a public address system (PA) is used. Audio mixing may also be done in studios as part of multi-track recording in order to produce digital or analog audio recordings, or as part of an album, film, or television program. An audio mixing console, or mixing desk, or mixing board, has numerous rotating controls (potentiometers) and sliding controls (faders which are also potentiometers) that are used to manipulate the volume, the addition of effects such as reverb, and frequency content (equalization) of audio signals. On most consoles, all the controls that apply to a single channel of audio are arranged in a vertical column called a channel strip. Larger and more complex consoles such as those used in film and television production can contain hundreds of channel strips. Many consoles today, regardless of cost, have automation capabilities so the movement of their controls is performed automatically, not unlike a player piano.

Certain terms used herein will now be defined. RMS (root means square) is a level value based upon the energy that is contained in a given audio signal. Peak value describes the instantaneous maximum amplitude value within one period of the signal concerned. DAW (digital audio workstation) is a software environment used to record, edit and mix audio files. Crest factor is the peak/RMS ratio. Loudness Unit (LU) is a unit that considers the perceived loudness of an audio signal regarding duration and frequency weighting. Keyframes are level changes in an audio track, and wherein the slope of the change or the time required to transition from one level to another can be adjusted.

SUMMARY

Conventional mechanisms such as those explained above suffer from a variety of deficiencies. One such deficiency is that the visual designer is collecting all his video and audio files within a timeline application (e.g., Premiere Pro® available from Adobe Systems, Incorporated of San Jose, Calif.) and facing the problem that the entire audio "sequence" has to be mixed. The visual designer may be well versed regarding video editing and processing, but may be much less so when it comes to audio mixing. The usual approach is to set all audio tracks to more or less static values, some more experienced people do some mixing via keyframe setting and adjustment. Fades with program pending fade curves only happen occasionally.

Most timeline applications provide a wide variety tools to mix audio but the average user has no clue how to use all the functionality (knobs and faders, keyframe functionality, etc.) implemented in an application. Conventional time line based applications do not offer audio mixing suggestion to the user. The knobs and faders are set to default values, the user has to set all audio level changes manually, in other words, the user has to mix the audio (for example by changing controls or setting keyframe values). Not only does the mixing have to be done manually by the user, but further the clip volumes are adjusted relatively to each other, and fades for transitions are manually added. This process tends to be cumbersome and time consuming.

Embodiments of the invention significantly overcome such deficiencies and provide mechanisms and techniques that automatically mix complex audio structures within a timeline based application like a Digital Audio Workstation (DAW) or Video Editing Application.

A "Foreground/Background" metaphor is utilized as part of the mixing technique. The method incorporates user information about "prominent" (Foreground) and "non-prominent" (Background) audio that is best explained with mixing a documentary or a movie trailer where the narrator/voice-over is the important component (Foreground) of the audio mix while the remainder of the audio clips comprises the background. The method, however, is not limited to only having foreground/background and in general can be extended to any number of N priorities. A higher priority always keys or controls a lower priority.

In a particular embodiment of a method for providing intelligent audio mixing, a plurality of audio tracks are displayed in a user interface, each track of the plurality of tracks including at least one audio clip. The user designates each audio clip as either a foreground clip or a background clip. The foreground clips are analyzed and equalized level-wise to have the same perceived loudness thereafter. The background clips are analyzed and a loudness distance value between the loudness corrected foreground clips (equal loudness) and the background clips is defined. Dependent on the computed loudness distance keyframes are generated and added to some of the audio clips, thereby providing a fade between levels of the background clips to take into account the loudness corrected foreground clips.

Other embodiments include a computer readable medium having computer readable code thereon for providing audio mixing. The computer readable medium includes instructions for displaying a plurality of tracks in a user interface, each track of the plurality of tracks including at least one audio clip. The computer readable medium also includes instructions for receiving a designation for each audio clip into one of a foreground clip and a background clip. Further, the computer readable medium includes instructions for analyzing and loudness correcting the foreground clips and instructions for analyzing the background clips and defining a loudness distance value between the loudness corrected foreground clips and the background clips. Additionally, the computer readable medium includes instructions for generating and adding keyframes dependent on the computed loudness distance to some of the audio clips, the keyframes providing a fade between levels of the background clips to take into account the loudness corrected foreground clips and instructions for providing a sequenced audio file from the loudness corrected foreground clips, the background clips and the keyframes.

Still other embodiments include a computerized device, configured to process all the method operations disclosed herein as embodiments of the invention. In such embodiments, the computerized device includes a memory system, a processor, communications interface in an interconnection mechanism connecting these components. The memory system is encoded with a process that provides audio mixing as explained herein that when performed (e.g. when executing) on the processor, operates as explained herein within the computerized device to perform all of the method embodiments and operations explained herein as embodiments of the invention. Thus any computerized device that performs or is programmed to perform up processing explained herein is an embodiment of the invention.

Other arrangements of embodiments of the invention that are disclosed herein include software programs to perform the method embodiment steps and operations summarized above and disclosed in detail below. More particularly, a computer program product is one embodiment that has a computer-readable medium including computer program logic encoded thereon that when performed in a computerized device provides associated operations providing audio mixing as explained herein. The computer program logic, when executed on at least one processor with a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), floppy or hard disk or other a medium such as firmware or microcode in one or more ROM or RAM or PROM chips or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the invention. The system of the invention can be distributed between many software processes on several data communications devices, or all processes could run on a small set of dedicated computers, or on one computer alone.

It is to be understood that the embodiments of the invention can be embodied strictly as a software program, as software and hardware, or as hardware and/or circuitry alone, such as within a data communications device. The features of the invention, as explained herein, may be employed in data communications devices and/or software systems for such devices such as those manufactured by Adobe Systems Incorporated of San Jose, Calif.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the presently disclosed method and apparatus provide an audio mix proposal by proposing relatively corrected track level settings as well as individual keyframe settings per track to accommodate the loudness difference between the foreground and the background tracks/clips. Fades are used to lead in/out of clips with different content.

Figure 1:
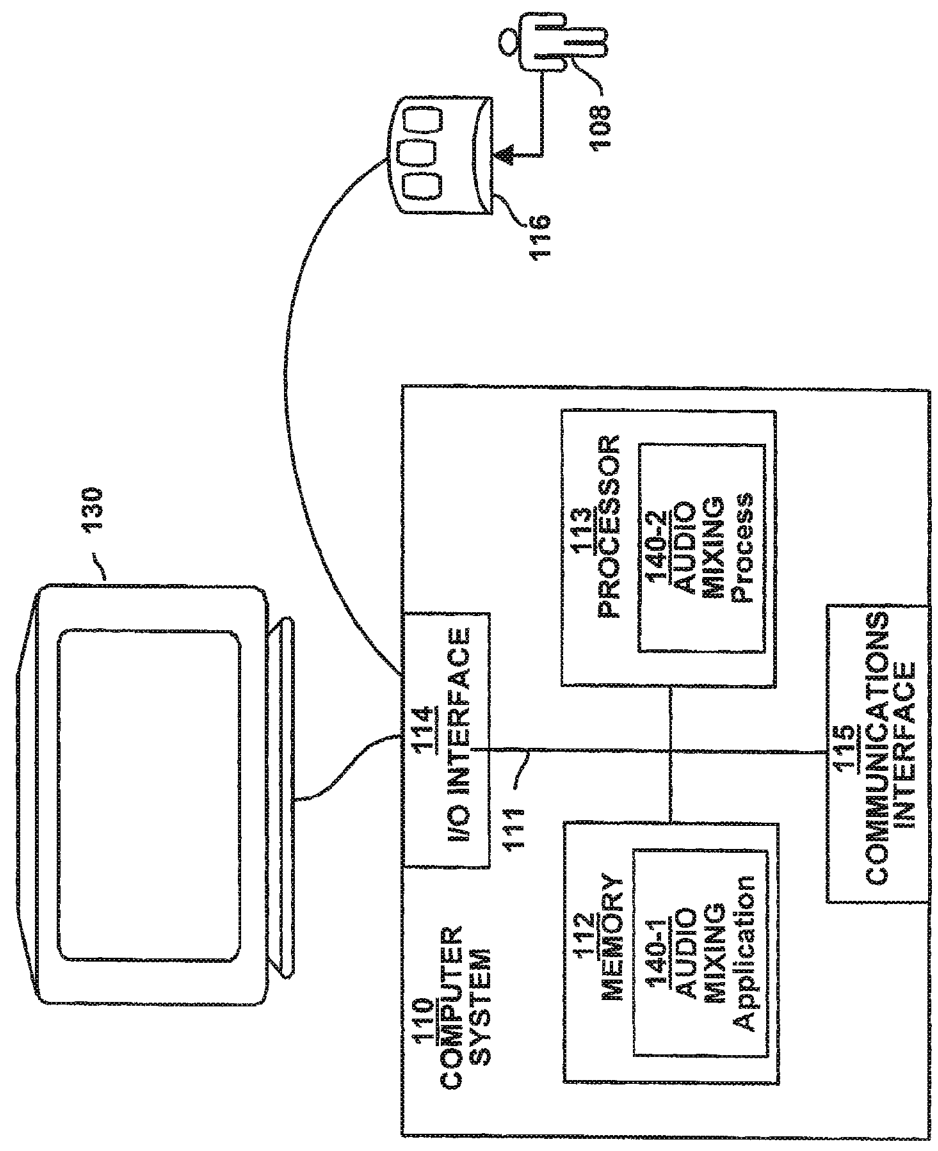
FIG. 1 illustrates an example computer system architecture for a computer system that performs audio mixing in accordance with embodiments of the invention.

FIG. 1 is a block diagram illustrating an example computer system 100 (e.g., video server 12 and/or video clients 16, 18 or 20 as shown in FIG. 1) for implementing audio mixing functionality 140 and/or other related processes to carry out the different functionality as described herein.

As shown, computer system 100 of the present example includes an interconnect 111 that couples a memory system 112 and a processor 113 an input/output interface 114, and a communications interface 115.

As shown, memory system 112 is encoded with audio mixing application 140-1. Audio mixing application 140-1 can be embodied as software code such as data and/or logic instructions (e.g., code stored in the memory or on another computer readable medium such as a disk) that support functionality according to different embodiments described herein.

During operation, processor 113 of computer system 100 accesses memory system 112 via the interconnect 111 in order to launch, run, execute, interpret or otherwise perform the logic instructions of the audio mixing application 140-1. Execution of audio mixing application 140-1 produces processing functionality in audio mixing process 140-2. In other words, the audio mixing process 140-2 represents one or more portions of the audio mixing application 140-1 (or the entire application) performing within or upon the processor 113 in the computer system 100.

It should be noted that, in addition to the audio mixing process 140-2, embodiments herein include the audio mixing application 140-1 itself (i.e., the un-executed or non-performing logic instructions and/or data). The audio mixing application 140-1 can be stored on a computer readable medium such as a floppy disk, hard disk, or optical medium. The audio mixing application 140-1 can also be stored in a memory type system such as in firmware, read only memory (ROM), or, as in this example, as executable code within the memory system 112 (e.g., within Random Access Memory or RAM).

In addition to these embodiments, it should also be noted that other embodiments herein include the execution of audio mixing application 140-1 in processor 113 as the audio mixing process 140-2. Those skilled in the art will understand that the computer system 100 can include other processes and/or software and hardware components, such as an operating system that controls allocation and use of hardware resources associated with the computer system 100.

Figure 2:
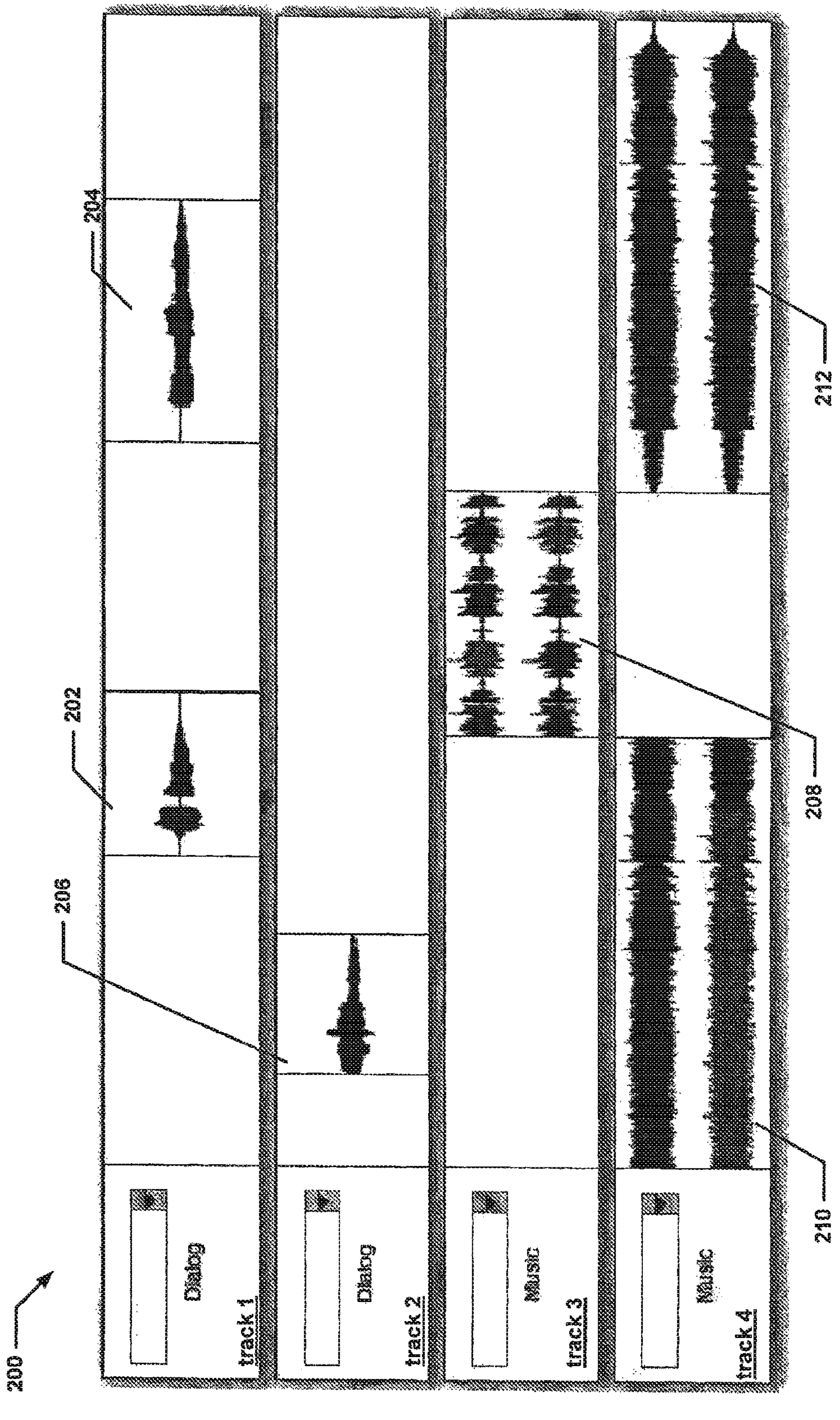
FIG. 2 depicts a screen shot showing an initial set of audio clips.

Referring now to FIG. 2, a screen shot of a graphical user interface (GUI) 200 for an audio mixing application is shown.

The GUI 200 includes graphical representations of four audio tracks, labeled track 1, track 2, track 3 and track 4. It should be appreciated that while audio tracks or clips are described, the concepts also apply to video tracks or video clips having an audio component as well. Track 1 includes two audio clips 202 and 204. The two audio clips 202 and 204 of track 1 are both voice clips. Track 2 includes a single audio clip 206, as does track 3, which includes audio clip 208. Audio clip 206 comprises a baby animal audio clip, and audio clip 208 comprises a location recording audio clip. Track 4 includes two audio clips as well, clips 210 and 212, both of which are music audio clips.

Figure 3:
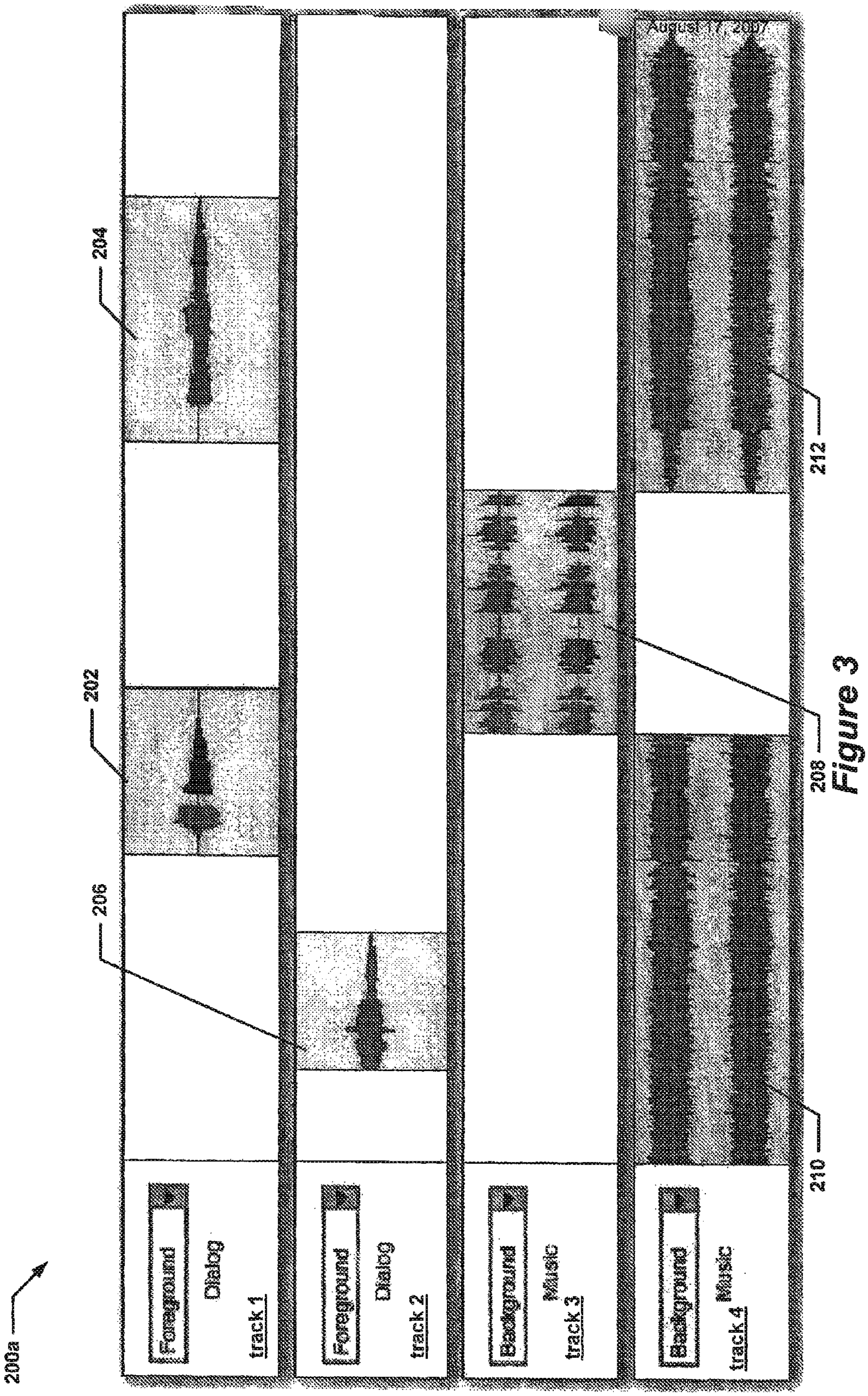
FIG. 3 depicts a screen shot wherein the clips/tracks of FIG. 1 have been designated as either foreground or background.

Referring now to FIG. 3, a screen shot of GUI 200*a* is shown. A first task in the audio mixing process is to designate each track or each clip of each track as either foreground or background. The user of the audio mixing application designates each clip of each track as either foreground or background. In this example, clips 202 and 204 of track 1 and clip 206 of track 2 have been designated as foreground clips. Clip 208 of track 3 and clips 210 and 212 of track 4 have been designated as background. In a particular embodiment this is accomplished by a user interface button or control having an on/off selection state that is operated by the user.

Figure 4:
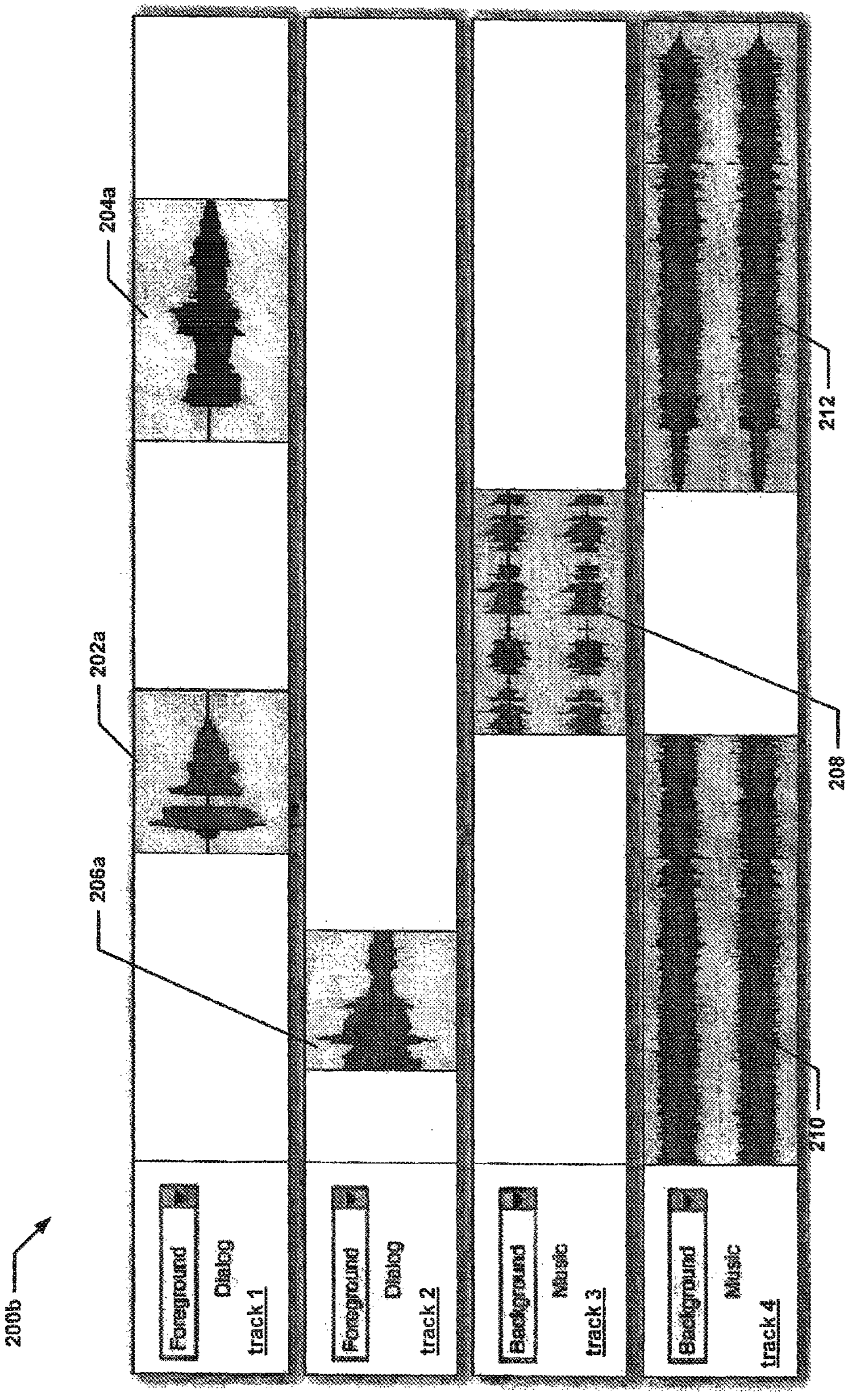
FIG. 4 depicts a screen shot wherein the foreground clips/tracks have been normalized.

Referring now to FIG. 4, following the designation of track or clips as either foreground or background, all audio clips designated as foreground (clips 202, 204 and 206 in this example) are loudness corrected (e.g., loudness corrected regarding one or more of RMS, Peak values, crest factors or Loudness units). This is shown in GUI 200*b* wherein clips 202*a*, 204*a* and 206*a* represent normalized version of clips 202, 204 and 206 as shown in FIG. 2.

The level correction of the foreground clips serves to equalize the clips level-wise, achieving the same perceived loudness. In one particular embodiment, the average loudness value over all foreground clips is computed and each clip level is adjusted relatively to match to the average loudness value. The measurement of the loudness value can be done by computing the RMS value or other methodologies can be applied (use peak values, crest factors, loudness units, as well as RMS values or various combinations thereof plus additional filtering). This principle can be extended to use additional criteria such as a Crest factor, which is equal to a Peak/RMS ratio. Weighting can be achieved by filtering the audio signal before computing the loudness value. The loudness corrected clips are shown as clips 202*a*, 204*a* and 206*a*. All level values are at a default level. The loudness corrected foreground clips 202*a*, 204*a* and 206*a* now have the same perceived loudness.

Next, all audio clips designated Background are analyzed. Then a preset (either predefined or user selected) is used to define a level "distance" between "Foreground" and "Background" levels. This can be automated if meta data provides information of the kind/genre of the audio. For example if the audio clip is intended as a movie trailer, a smaller distance value would be used since there is not much level difference between the announcer (foreground) and the background audio. On the other hand, if the audio clip were intended as a documentary, a larger distance value would be used since you want a more minimal background when the narrator is speaking.

Figure 5:
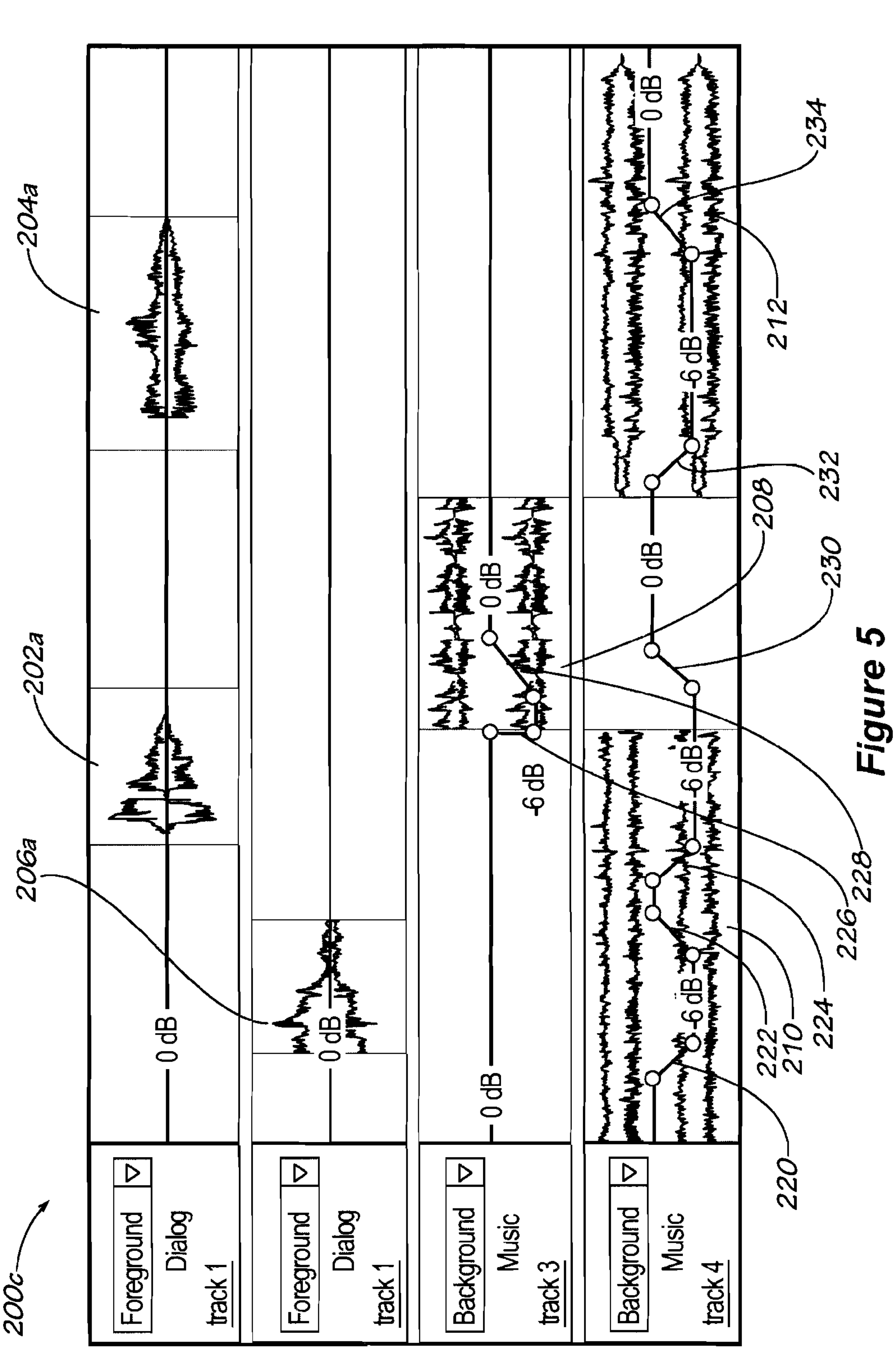
FIG. 5 depicts a screen shot wherein the background clips have had keyframes added thereto.

Referring now to FIG. 5, GUI 200*c* now shows keyframes added to the entire audio sequence. Keyframes are used to make the level transitions between clips by arranging the keyframes to form fade up/down's. Beginning from left to right, the first keyframe 220 shows a level change for track 4 from a first level to a second level at the time clip 206*a* begins. Thus, the music from track 4 is played until keyframe 220 is encountered, at which time the level of the music clip 210 is lowered to allow the clip 206*a* to be heard. At the conclusion of clip 206*a*, keyframe 222 is encountered in track 4 which transitions the level of clip 210 from the second level back to the first level.

This continues until keyframe 224 is encountered. At keyframe 224, a level change for track 4 from the first level to the second level is performed at the time clips 202*a* begins. The level of the music clip 210 is lowered to allow the clip 202*a* to be heard.

Next keyframe 226 in track 3 is encountered. The transition from first level to second level for clip 208 is lowered immediately since clip 202*a* is still active. Once clip 202*a* ends, keyframe 228 is encountered which raises the level of track 3 from the second level to the first level. Additionally keyframe 230 is encountered and transitions track 4 from the second level to the first level.

As clip 208 of track 3 ends, keyframe 232 is encountered which transitions track 4 (clip 212) from the first level to the second level. At this time clip 204*a* of track 1 is played. Once clip 204*a* completes, keyframe 234 is encountered which raises the level of track 4 back to the first level from the second level.

The entire mix proposal is now visualized via the keyframe settings. The keyframes can be adjusted (the location and the rate of level change) by the user to fine-tune a mixing session. After the user has finalized the mix proposal, the entire mixed audio is rendered out.

In this example, the final audio mix begins with music clip 210 being played at a first level. The music level is lowered to allow clip 206*a* to be played in its entirety, after which the music clip 210 is transitioned back to the first level. The music clip 210 is played at that level until voice clip 202*a* is played in its entirety, while the music is lowered to a second level. Before the voice clip 202*a* is finished, the level of clip 208 is sharply reduced so as not to conflict with the end of voice clip 202*a*. Once voice clip 202*a* is finished, clip 208 has its level transitioned from the second level to the first level. Shortly after the beginning of clip 208 begins, the level of track 4 is transitioned back to the first level. Since there is no clip to play, there is no conflict with clip 208, except at the very end of clip 208 where the music clip 212 plays at the first level before transitioning down to the second level so that voice clip 204*a* can be heard. Upon the completion of voice clip 204*a*, the music clip 212 is brought back up to the first level.

Figure 6:
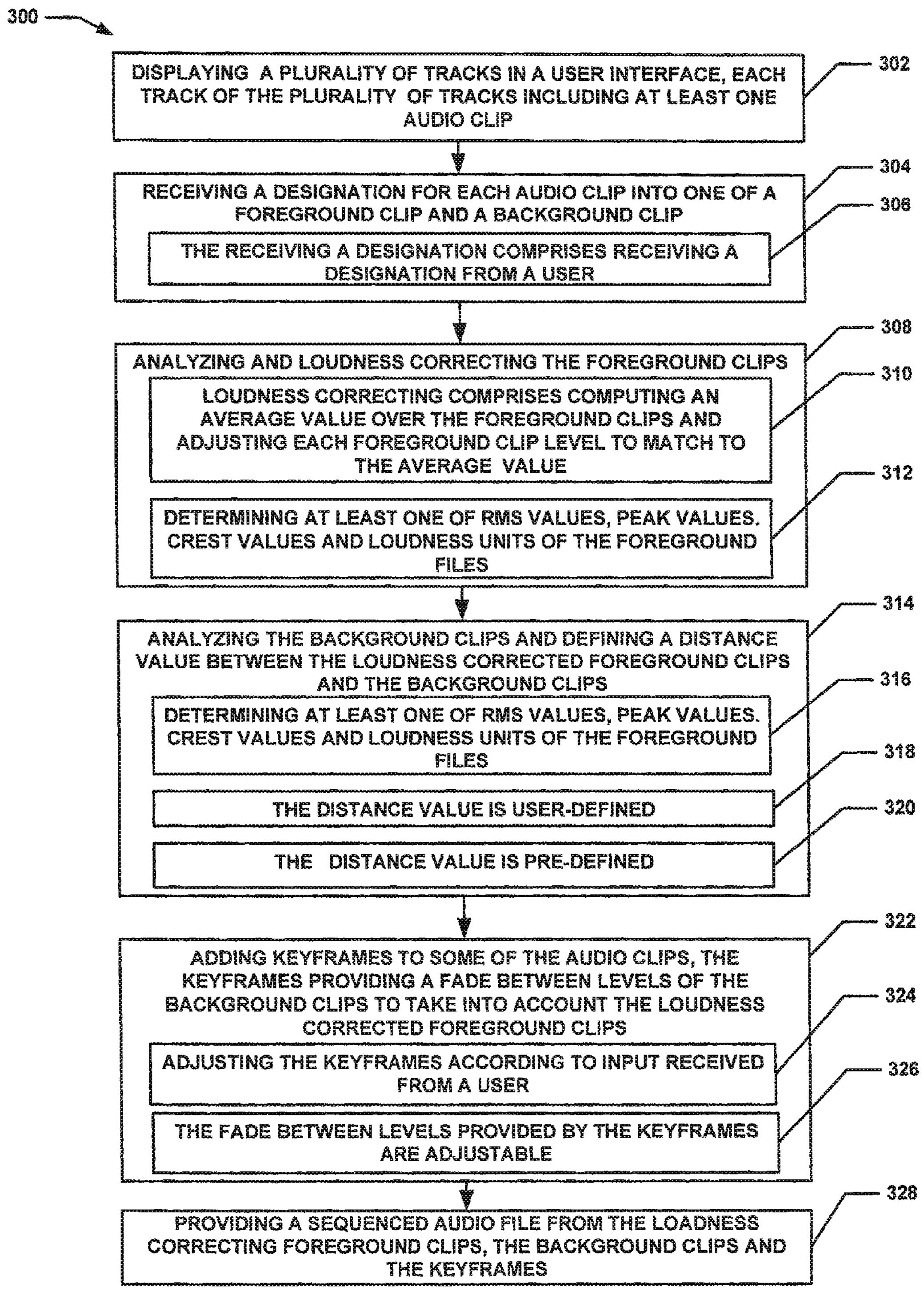
FIG. 6 is a flow diagram of a particular embodiment of a method of audio mixing in accordance with embodiment of the invention.

A flow chart of the presently disclosed method is depicted in FIG. 6. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 6, a particular embodiment of a method 300 for providing audio mixing is shown. The method 300 begins with processing block 302, which discloses displaying a plurality of tracks in a user interface, each track of said plurality of tracks including at least one audio clip. The user interface may be part of a software application running on a digital audio workstation (DAW). Each clip in a sequence is visually displayed on screen and requires preprocessed peak data to represent the audio data. Typically only peak data is used, but also loudness describing data can be computed as well.

Processing block 304 states receiving a designation for each audio clip into one of a foreground clip and a background clip. As show in processing block 306, the receiving a designation comprises receiving a designation from a user. The user, by way of the user interface, designates each clip as either a foreground clip or a background clip. In some embodiments this may be done at the track level, wherein each track is designated as either background or foreground and all the clips of the track receive the same designation as the track they belong to.

Processing block 308 recites analyzing and loudness correcting the foreground clips. As shown in processing block 310 loudness correction comprises computing an average loudness value over the foreground clips and adjusting each foreground clip level to match to the average value. As further shown in processing block 312, the analyzing foreground clips comprises determining at least one of RMS values, peak values, crest values and loudness units of the foreground clips.

Processing continues with processing block 314, which states analyzing the background clips and defining a distance value between the corrected foreground clips and the background clips. Presets provided by the application can be used. For example if the audio clip is intended as a movie trailer, a smaller distance value would be used since there is not much level difference between the announcer (foreground) and the background audio. On the other hand, if the audio clip were intended as a documentary, a larger distance value would be used since you want a more minimal background when the narrator is speaking.

Processing block 316 states the analyzing background files comprises determining at least one of RMS values, peak values, crest values and loudness units of the background files. As shown in processing block 318, the distance value is user-defined. Alternately, as shown in processing block 320, the distance value is pre-defined.

Processing block 322 recites adding keyframes to some of the audio clips, the keyframes providing a fade between levels of the background clips to take into account the loudness corrected foreground clips. Processing block 324 discloses adjusting the keyframes according to input received from a user. The user can tweak the locations in the audio where the keyframes occur. Processing block 326 states the fade between levels provided by the keyframes are adjustable. The user can alter the rate of transition from one level to other.

Processing block 328 recites providing a sequenced audio file from the loudness corrected foreground clips, the background clips and the keyframes.

Having described preferred embodiments of the invention it will now become apparent to those of ordinary skill in the art that other embodiments incorporating these concepts may be used. Additionally, the software included as part of the invention may be embodied in a computer program product that includes a computer useable medium. For example, such a computer usable medium can include a readable memory device, such as a hard drive device, a CD-ROM, a DVD-ROM, or a computer diskette, having computer readable program code segments stored thereon. The computer readable medium can also include a communications link, either optical, wired, or wireless, having program code segments carried thereon as digital or analog signals. Accordingly, it is submitted that that the invention should not be limited to the described embodiments but rather should be limited only by the spirit and scope of the appended claims.

What is claimed is:

1. A method comprising:
displaying a first track and a second track in a user interface of a computer system;
determining, via the computer system, a first keyframe for the first track, the first keyframe decreasing a loudness of a first audio clip in the first track from a first level of loudness to a second level of loudness based at least in part on a second audio clip in the second track; and
determining, via the computer system, a second keyframe for the first track, the second keyframe increasing the loudness of the first audio clip in the first track from the second level of loudness to the first level of loudness based at least in part on the second audio clip in the second track of the plurality of tracks.

2. The method of claim 1 wherein:
the first keyframe decreases the loudness of the first audio clip in conjunction with a beginning of a second audio clip in the second track; and
the second keyframe increases the loudness of the first audio clip in conjunction with a termination of the second audio clip in the second track of the plurality of tracks.

3. The method of claim 1 wherein the first and second keyframes provide fades between the first loudness level and the second loudness level.

4. The method of claim 3 wherein the fades are adjustable by input received at the computer system.

5. The method of claim 1 wherein the second track does not include another audio clip prior to the beginning of the second audio clip in the second track.

6. The method of claim 1 wherein the second track is a foreground track and the first track is a background track.

7. The method of claim 1 wherein the second clip is a foreground clip and the first clip is a background clip.

8. The method of claim 1 further comprising:
determining, via the computer system, a third keyframe for a third track displayed in the user interface, the third keyframe immediately decreasing a loudness of a third audio clip in the third track from the first level of loudness to the second level of loudness, the keyframe decreasing the loudness of the third clip occurring in conjunction with a beginning of the third clip and a termination of the first clip, wherein the first track and third track are background tracks.

9. The method of claim 1 further comprising providing, from the computer system, a sequenced audio file using at least the first audio clip, the second audio clip, the first keyframe, and the second keyframe.

10. The method of claim 1 further comprising:
determining at least one of RMS values, peak values, crest values and loudness units of all of multiple foreground clips displayed in the user interface, wherein the second clip is one of the multiple foreground clips; and
loudness adjusting the multiple foreground clips.

11. The method of claim 1 further comprising displaying the first keyframe and the second keyframe on the user interface.

12. The method of claim 1 wherein the first keyframe and the second keyframe are determined automatically.

13. A non-transitory computer readable medium having computer readable code thereon, the medium comprising:

instructions for displaying a first track and a second track in a user interface of a computer system;

instructions for determining, via the computer system, a first keyframe for the first track, the first keyframe decreasing a loudness of a first audio clip in the first track from a first level of loudness to a second level of loudness based at least in part on a second audio clip in the second track; and instructions for determining, via the computer system, a second keyframe for the first track, the second keyframe increasing the loudness of the first audio clip in the first track from the second level of loudness to the first level of loudness based at least in part on the second audio clip in the second track of the plurality of tracks.

14. The computer readable medium of claim 13 wherein:

the first keyframe decreases the loudness of the first audio clip in conjunction with a beginning of a second audio clip in the second track; and the second keyframe increases the loudness of the first audio clip in conjunction with a termination of the second audio clip in the second track of the plurality of tracks.

15. The computer readable medium of claim 13 wherein the second track is a foreground track and the first track is a background track.

16. The computer readable medium of claim 13 wherein the second clip is a foreground clip and the first clip is a background clip.

17. The computer readable medium of claim 13 wherein the medium further comprises:

instructions for determining, via the computer system, a third keyframe for a third track displayed in the user interface, the third keyframe immediately decreasing a loudness of a third audio clip in the third track from the first level of loudness to the second level of loudness, the keyframe decreasing the loudness of the third clip occurring in conjunction with a beginning of the third track and a termination of the first track, wherein the first track and third track are background tracks.

18. A computer system comprising:

a memory;

a processor;

a communications interface;

an interconnection mechanism coupling the memory, the processor and the communications interface; and wherein the memory is encoded with an application providing audio mixing, that when performed on the processor, provides a process for processing information, the process causing the computer system to perform the operations comprising:

displaying a first track and a second track in a user interface of a computer system;

determining, via the computer system, a first keyframe for the first track, the first keyframe decreasing a loudness of a first audio clip in the first track from a first level of loudness to a second level of loudness based at least in part on a second audio clip in the second track; and determining, via the computer system, a second keyframe for the first track, the second keyframe increasing the loudness of the first audio clip in the first track from the second level of loudness to the first level of loudness based at least in part on the second audio clip in the second track of the plurality of tracks.

19. The computer system of claim 18 wherein:

the first keyframe decreases the loudness of the first audio clip in conjunction with a beginning of a second audio clip in the second track; and the second keyframe increases the loudness of the first audio clip in conjunction with a termination of the second audio clip in the second track of the plurality of tracks.

20. The computer system of claim 18 wherein, when performed on the processor, the operations further comprise:

determining a third keyframe for a third track displayed in the user interface, the third keyframe immediately decreasing a loudness of a third audio clip in the third track from the first level of loudness to the second level of loudness, the keyframe decreasing the loudness of the third clip occurring in conjunction with a beginning of the third track and a termination of the first track, wherein the first track and third track are background tracks.

21. The computer system of claim 18 wherein, when performed on the processor, the operations further comprise displaying the first keyframe and the second keyframe on the user interface.

* * * * *